United States Patent
Gruenberg et al.

(10) Patent No.: US 8,233,564 B2
(45) Date of Patent: Jul. 31, 2012

(54) METHOD AND APPARATUS FOR INCREASING THE CHANNEL CAPACITY OF A BANDWIDTH LIMITED COMMUNICATIONS PATH

(75) Inventors: Elliot L. Gruenberg, West New York, NJ (US); Patrick Antaki, Plano, TX (US); Dhadesugoor Vaman, Frederick, MD (US); David N. Judelson, New York, NY (US)

(73) Assignee: Digital Compression Technology LPNY (US)

(*) Notice: Subject to any disclaimer, the term of this patent is extended or adjusted under 35 U.S.C. 154(b) by 0 days.

(21) Appl. No.: 13/198,320

(22) Filed: Aug. 4, 2011

(65) Prior Publication Data

US 2011/0299620 A1 Dec. 8, 2011

Related U.S. Application Data (63) Continuation-in-part of application No. 12/652,885, filed on Jan. 6, 2010, now abandoned.

(60) Provisional application No. 61/142,768, filed on Jan. 6, 2009.

(51) Int. Cl.
*H03C 3/00* (2006.01)

(52) U.S. Cl. ........ 375/307; 375/367; 375/278; 375/284; 375/313; 375/346; 375/254; 375/296; 455/63.1; 708/300; 708/819

(58) Field of Classification Search ................... 375/307, 375/267, 278, 284, 313, 346, 254, 296; 333/28; 455/63.1; 708/300, 819

See application file for complete search history.

(56) References Cited

U.S. PATENT DOCUMENTS

| | | | |
|---|---|---|---|
| 3,518,557 A * | 6/1970 | Harmuth et al. | ............... 327/98 |
| 5,761,237 A | 6/1998 | Peterson et al. | |
| 5,956,372 A | 9/1999 | Vaman et al. | |
| 6,075,817 A | 6/2000 | Gruenberg et al. | |
| 6,317,409 B1 | 11/2001 | Murakami | |
| 7,336,747 B2 | 2/2008 | Gruenberg et al. | |
| 2004/0208271 A1 * | 10/2004 | Gruenberg et al. | ........... 375/355 |
| 2006/0014491 A1 | 1/2006 | Cleveland | |
| 2008/0290937 A1 | 11/2008 | Mirow | |
| 2009/0051458 A1 | 2/2009 | Miller et al. | |

OTHER PUBLICATIONS

Slock, Dirk T.M. et ano., "An Interference Cancelling Multichannel Matched Filter", Global Telelcommunications Conference, Communications: The Key to Global Prosperity, Nov. 18-22, 1996, pp. 214-218, London, UK.

* cited by examiner

*Primary Examiner* — Juan A Torres
(74) *Attorney, Agent, or Firm* — Keith D. Nowak; Carter Ledyard & Milburn LLP (57) ABSTRACT

A unique digital compression technology for increasing the information carrying capacity of a bandwidth limited communications path highway by using a combined coding and modulation technique. The inventive technology allows multiple independent modulated data streams to simultaneously and instantaneously share the same bandwidth without cross-channel interference. A matched filter is used to substantially reduce the error rate and utilizes a unique training method based on performing a spectral response test. An algorithm calculates the effect of the unique characteristics of the communications highway on the transmitted signal and generates an ideal signal stored in the matched filter for comparison with received signals.

20 Claims, 6 Drawing Sheets

METHOD AND APPARATUS FOR INCREASING THE CHANNEL CAPACITY OF A BANDWIDTH LIMITED COMMUNICATIONS PATH

CROSS-REFERENCE TO RELATED APPLICATIONS

This application is a Continuation-in-Part of U.S. patent application Ser. No. 12/652,885, filed Jan. 6, 2010 now abandoned and is related to and claims the benefit of U.S. Provisional Patent Application Ser. No. 61/142,768, filed Jan. 6, 2009, U.S. Pat. Nos. 5,956,372, 6,075,817 and 7,336,747, all of which are incorporated herein by reference.

FIELD OF THE INVENTION

The present invention relates to method and apparatus for increasing the channel capacity of a bandwidth limited communications path, including the Telephone Twisted Pair (TTP) cable, optic fiber pipelines, microwave communication systems, mobile and personal communication networks and satellite communication networks.

BACKGROUND OF THE INVENTION

Immediate and high speed access to the vast amount of digital information available today is in critical demand for home entertainment, business communications and wireless communication devices.

One example of this demand, and the resources being applied to fulfill it, is the "triple play" effort being put forth by cable and telephone companies to supply high-speed internet access, television programming and telephone service over a single broadband connection.

For the telephone companies, the triple play is delivered to a resident or a business using a combination of optical fiber and Asynchronous Digital Subscriber Line (ADSL) technology. This configuration uses optical fiber to reach areas at long distances from the telephone central office, and uses ADSL or VDSL (Very-High-Data-Rate Digital Subscriber Line) over an existing TTP as the last mile to the home or business. This two step approach is necessary as Digital Subscriber Line (DSL) technology suffers from significant degradation in bandwidth over long distances.

It has been estimated that the bandwidth required to provide advanced triple-play services will require a downstream (head end or central office to residence or business) data rate of between 37 and 57 Mbits/sec. This is based on an average of 3 High Definition TV (HDTV) sets per household requiring 9-12 Mbits/sec each, high speed internet at 10-20 Mbits/sec, and IP voice at 0.25 Mbits/sec.

There are a number of basic DSL services for possible use with a triple play service; including ADSL, ADSL2+ and VDSL. ADSL can provide a downstream bandwidth of approximately 2 Mbits/sec at a distance of 18,000 feet, and 6 Mbits/sec at a distance of 6000 feet. ADSL 2+ can provide an approximate bandwidth of 25 Mbits/sec at 3000 feet using a second twisted pair. VDSL can provide an approximate bandwidth of 25 Mbits/sec at 3000 feet and the possibility of 57 Mbits/sec at 1000 feet using a second twisted pair. Therefore in order for a telephone company to provide a full service triple play configuration with existing DSL technology, it is necessary to install fiber optic networks which are accessible within approximately 1000 feet of every home or business.

Cable television operators face a similar problem as the majority of their current installations are Coaxial cable which cannot support the required bandwidth over long distances. Therefore they must also install fiber optic networks and use available coaxial cable, rather than a TTP for the last transmission mile. For cable companies the Hybrid Fiber Coaxiel (HFC) architecture is used for television programming and high-speed Internet access, while Voice over IP (VOIP) is used to deliver telephone service.

It is estimated that U.S. phone companies alone will have to spend more than $26 Billion to install the fiber optic networks needed for triple play service.

For wireless communications, advances in Code Division Multiple Access (CDMA) and Global System for Mobile Communications (GSM) standards are also providing another medium to deliver video, Internet access and voice telephone service. Thus the triple play is becoming the "quadruple play" which means greater demand for available bandwidth. This demand is shown by the recent 700 MHz auction in the U.S. which yielded $19 Billion in bids while telephone companies in the U.S. have bid $71 Billion for spectrum since 1995.

The goal of the present invention, to increase the information carrying capacity for any type of communications highway, requires an understanding of the basic theory underlying channel capacity as developed by Claude Shannon and Ralph Hartley. The Shannon-Hartley Theorem is an application of the noisy channel coding Theorem to the archetypal case of a continuous-time analog communications channel subject to Gaussian noise. The theorem establishes channel capacity, a bound on the maximum amount of error-free digital data (pulse based information) that can be transmitted over a communication link, with a specified bandwidth and in the presence of the noise interference. The theorem is based on the assumption that the signal power is bounded and the Gaussian noise process is characterized by a known power or power spectral density. To achieve this goal, conventional methods attempt to increase the number of bits per single modulating frequency using efficient technology enhancements. The improvement is limited since noise on the channel remains the same. The present invention sends multiple frequencies, each on its own virtual channel, with minimal increase in total physical channel bandwidth and ensures that each modulated frequency achieves maximum capacity within the constraints of the Shannon limit. The combined information throughput is the sum of capacities for all virtual channels. In essence the proposed invention provides a methodology for combining many virtual channels within the same constrained channel bandwidth that no other known systems can achieve.

Considering all possible multi-level and multi-phase encoding techniques, the Shannon-Hartley theorem states that the channel capacity C, meaning the theoretical upper bound on the rate of clean (error free) data that can be sent with a given average signal power S through an analog communication channel subject to additive white Gaussian noise of power N is given by;

$$C = B \log_2(1 + S/N)$$

where:
C is the channel capacity in bits per second,
B is the bandwidth of the channel in hertz,
S is the total signal power over the bandwidth, measured in watts,
N is the total noise power over the bandwidth, measured in watts, and S/N is the signal-to-noise ratio (SNR) of the communication signal to the Gaussian noise interference, expressed as a straight power ratio.

The Shannon-Hartley Theorem establishes what the channel capacity is for a finite-bandwidth continuous-time channel subject to Gaussian noise. It also makes it clear that bandwidth limitations alone do not impose a cap on maximum information rate. That is because it is possible for a digital pulse signal to take on an indefinitely large number of different voltage levels on each symbol pulse, with each slightly different level being assigned a different meaning or bit sequence. However, when noise and bandwidth limitations are combined, the Shannon-Hartley Theorem taught that there was a finite limit to the amount of information that could be transferred by a signal of a bounded power even when various multi-level encoding techniques are used.

The finite limit on channel capacity postulated by the Shannon-Hartley Theorem is based in part on the fact that in the channel considered by this theorem, noise and signal are combined by addition. That is, the receiver receives a signal that is equal to the sum of the signal encoding the desired information and a continuous random variable that represents the noise. This addition creates uncertainty as to the value of the original encoded signal.

The Shannon-Hartley Theorem has been applied to all conventional communications systems and provides maximum data rate supported given the bandwidth of the channel and the Signal to Noise Ratio. In conventional systems, the modulated frequencies are not overlapped within nearly the same bandwidth, rather, each modulated frequency has a distinct bandwidth. Thus, to increase the data rate in conventional communications systems, bandwidth has to be increased. The Shannon-Hartley theorem is also applied to the proposed inventive technology described herein. However, the inventive technology described herein allows increased capacity due to the cumulative sum of multiple virtual channels with each having a modulated frequency (carrier) close to each other and still maintain nearly the same total bandwidth on the physical channel. In addition, as all these modulated frequencies (virtual channels) are transmitted onto the physical channel simultaneously their bandwidths significantly overlap. To recover the increased data capacity, the inventive technology suppresses the inter-carrier interference significantly by a combination of a Transmit Super Resonant Filter (TXSRF) at the transmitter, a Receiver Super Resonant Filter (RXSRF) and a Matched Filter, all of which are described below.

One type of noise is one or more data-carrying interfering carriers which occupy substantially the same bandwidth as the desired carrier signal. The inventive system utilizes spectrally overlapping data-carriers in a unique combination (using the Transmit and Receive SRF circuits) to increase the overall throughput of a transmission system, while neither increasing the overall signal bandwidth (as in spread-spectrum systems), nor by decreasing the SNR (as in multi-user CDMA systems). Finally, the inventive system's implementation of overlapping carriers is superior to orthogonal systems (such as Orthogonal Frequency Division Multiplexing (OFDM). Unlike the instant invention, OFDM systems are limited in that the choice of frequencies for separating carriers is very precisely set by rules of orthogonality, resulting in a marginal increase in overall data throughput for a given bandwidth.

The inventive process described below causes the difference between the cumulative energy of the signal and the cumulative energy of noise to become greater. This results in a significantly increased channel capacity heretofore not thought achievable. Since the modulated frequencies of different channels overlap within a constrained bandwidth, inter-carrier interference is more dominant than other noise. The present invention reduces the impact of all of the noise to increase the overall capacity. This decoupling of the noise and signal bandwidth achievable with the present invention represents a completely novel application of the Shannon-Hartley Theorem.

A basic reason for the inventive improvement in channel capacity described herein is the present invention does not rely on a digital pulse signal to convey information. Rather, the present invention transmits information by communicating the amplitude of discrete sinusoidal signals that remain fixed in amplitude in the same period in which the change in status at the transmitter is occurring. There is no abrupt change in amplitude from one bit period to the next as there is when information is sent as a pulse. Each discrete interval has its own sine wave inputs that develop as sine waves with time. This means that there are no sources of wide band spectra in this communication system as there is when information transfer is based on digital pulses.

The present invention provides for a huge improvement in the signal-to-noise ratio by blocking the detrimental effect of all channel noise except for the noise resident within a narrow bandwidth carrying the transmitted information signal.

SUMMARY OF THE INVENTION

The invention described herein is a unique digital compression technology which increases the channel capacity of a bandwidth limited communications highway by overlapping multiple modulated carriers and suppressing the inter-carrier interference. In essence, the sum capacity of the data carried by each of the modulated carriers will increase the capacity many fold. Also, the additive white Gaussian channel noise within the same bandwidth equally impacts all of the modulating carriers, thereby maintaining the same Signal to AWGN noise ratio on each modulated carrier and the sum capacity is maintained within the Shannon's capacity. Thus, this inventive technique results in an increase in channel capacity superior to what would be expected when determining bandwidth with the Shannon-Hartley theorem.

The inventive technique allows multiple independent modulated data streams to simultaneously share the same bandwidth without cross-channel interference. Unlike well known spread-spectrum methods, each data stream does not suffer from Signal-to-Noise-Ratio (SNR) degradation due to the presence of other channels. The inventive technique effectively increases the channel capacity of a communications highway by processing each modulated carrier for every symbol independently whereby the desired carrier is enhanced while undesired carriers (interferers) are not enhanced. This is accomplished by utilizing a narrow bandwidth filter while still maintaining the noise bandwidth the same for all overlapped modulated carriers, utilizing overlapping signals to carry additional information and by passing inherent noise through a narrow band filter in the receiver while the signal carrying information occupies the full bandwidth.

The invention further makes use of a matched filter system variant to conventional matched filters (which simply utilize a best match fit for an incoming signal corrupted by noise) to reduce the error rate over the communication highway. The matched filter is combined with the RXSRF in order to maximize the inter-carrier interference rejection from spectrally overlapping data-carrying carriers. As the number of data carriers increases in a typical system (in order to increase the data throughput over a particular communications channel), the matched filter provides a convenient method for data detection following the RXSRF. In conventional systems a matched filter purely performs the best pre-stored signal match for data recovery from a received signal with channel added noise, where as in the inventive system, the matched filter works in combination with the Transmit and Receive SRF circuits where the noise and the inter-carrier rejection process is achieved and accommodates an increased number of overlapped modulated frequencies within the same bandwidth. Additionally, the matched filter utilizes a unique training method based on performing a spectral response test which transmits a series of pure frequencies in a predetermined sequence over the communication highway. An algorithm is utilized to calculate the effect of the unique characteristics of the communications highway on the transmitted signal. Based on that calculation an ideal signal is created and stored in the matched filter for comparison with signals received at the receiver portion of the inventive transmission system.

These and other features of the invention will be more fully appreciated from the following detailed description when taken in conjunction with the accompanying drawings.

DETAILED DESCRIPTION OF THE INVENTION

Figure 1:
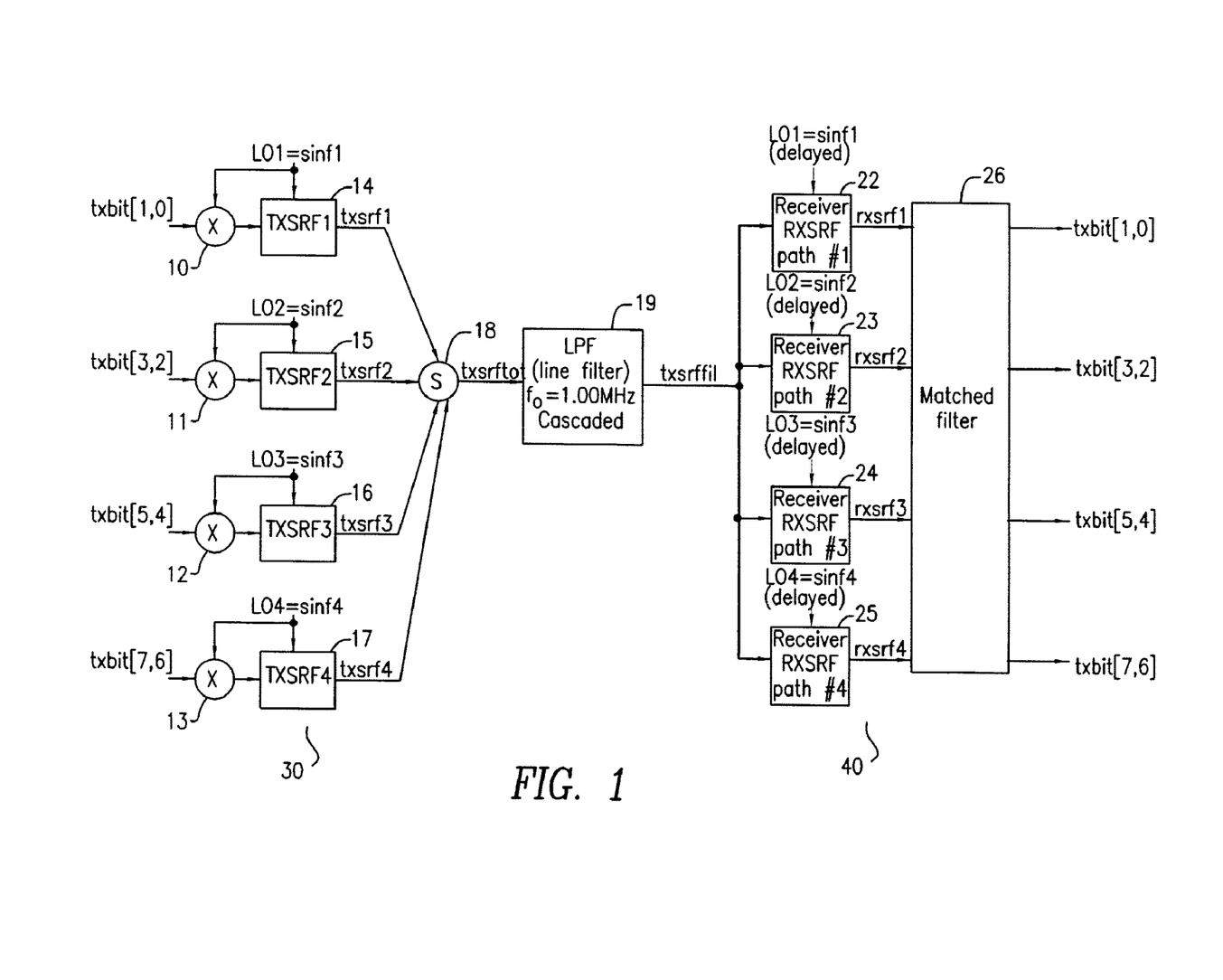
FIG. 1 is an overview of the inventive transmission system.

Referring now to FIG. 1 there is shown an overall system block diagram of the transmit and receive portions of the present invention. The system shown in FIG. 1 is a significant improvement to, and provides operational advantages over the communications systems described in U.S. Pat. Nos. 5,956,372, 6,075,817 and 7,336,747, the teachings of all three patents being incorporated herein by reference. Those improvements and operational advantages will be explained below.

As shown in FIG. 1 the transmitter section 30 of the present invention has multiple inputs, shown as inputs txbit (1,0) through txbit (7, 6) applied respectfully to the inputs of multiplier circuits 10-13.

In this exemplary embodiment an 8-bit input is split into four 2-bit words. Each 2-bit word is fed into its respective transmitter channel. There is no priori requirement for coding (for example randomizing, etc.) or arrangement of the 8-bit word before it is applied to multipliers 10-13, nor is there any requirement for which bits are applied to a particular transmit channel.

The choice of 2-bits per channel, as opposed to 1 or 8-bits per channel, is based on the overall system requirements such as Signal-to-Noise Ratio (SNR), channel type, data rate, power levels, noise profile, etc. It is to be understood however that the number of bits per channel is not a particular limitation of the present invention. That is because the present invention is a channel coding system rather than a source coding system. The only input requirement is that each symbol period be pre-defined.

An exemplary symbol period T for one embodiment of the invention is 1 μsec or 1 mega symbol/sec. For this example the incoming 8-bit word must arrive at an exact rate of one word per microsecond.

Also applied to multipliers 10-13 is the output of Local Oscillators (LO) L01-L04. Each local oscillator is a pure sine wave with a pre-set frequency and a fixed amplitude and is unique to each transmission channel. Each local oscillator is pre-set for a given system to have the same fixed phase relationship at the beginning of each 1 μsec period so that each sine wave starts at a zero phase angle. As an example, in the case of a 1.00 MHz local oscillator, a 360 degree sine wave will be completed within 1 μsec and looks like a continuous sine wave across multiple symbol periods. The remaining local oscillators are, by definition, not continuous as they can be lower or higher in frequency than 1.00 MHz. However, there is a predetermined built in delay at the end of each microsecond symbol period in order to re-start at a prescribed phase angle for the new symbol period. As an example, for a 9 frequency application there can be four frequencies below and four frequencies above 1.00 MHz.

For one embodiment a range of frequencies around the center frequency of 1.00 MHz can be used. This range is affected by a number of factors, including overall system bandwidth and the fact that at least one peak of a sine wave is required at the output of each TXSRF (items 14-17). The required peak occurs at 90 and 270 degrees for each local oscillator. In this embodiment the highest frequency used was 1.30 MHz and the lowest was 700 kHz with a 1 usec symbol period. Three bits were modulated on each frequency, except for the highest and lowest frequency which modulated 2-bits each for a total of 25 bits/symbol.

The bits applied to each multiplier 10-13, modulate the output of each local oscillator which is also applied to each multiplier as shown in FIG. 1. The output of each multiplier is applied to respective inputs of TXSRF1-TXSRF4.

Figure 2:
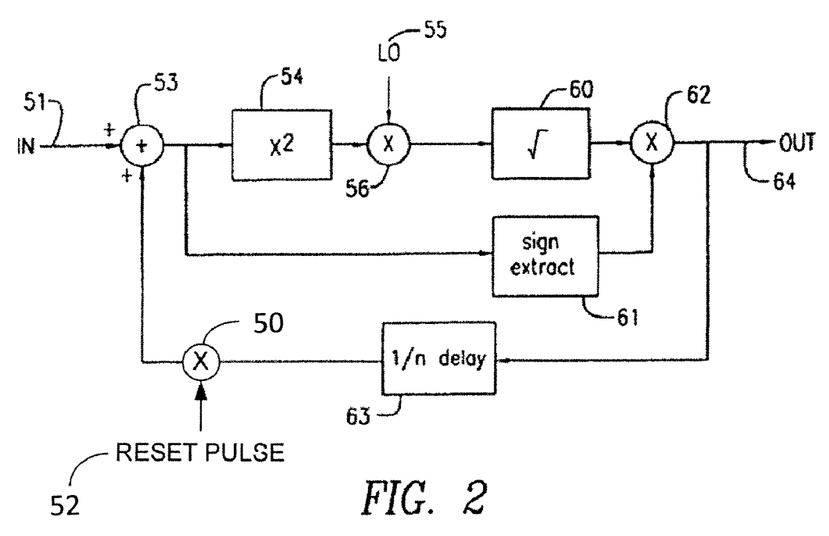
FIG. 2 is a schematic of one embodiment of a super resonant filter utilized with the present invention.

Referring now to FIG. 2 there is shown one embodiment of TXSRF1-TXSRF4. As described below the circuitry of RXSRF1-RXSRF4 is the same. This Super-Resonant Filter (SRF) circuit is a significant improvement over the type shown and described in U.S. Pat. No. 7,336,747 which is incorporated herein by reference. Additional embodiments of a SRF circuit are also shown in U.S. Pat. No. 7,336,747. The SRF circuit shown in FIG. 2 functions as a spike filter with a bandwidth of substantially less than 1/T, where T is the symbol period, and having a response time of T.

The super-resonant filter shown in FIG. 2 has advantages over prior art spike filters. One such advantage is the fast settling time of the super-resonant filter. The SRF transmits only a single frequency at a specific phase of sinusoidal input. The inputs may include noise which is itself a compilation of signals. A typical prior art DSL loop with feedback and feed forward loops includes both the transmitter and the receiver in the same loop (essentially, the telephone line is an element of the loop, whereas in the present invention each SRF loop is completely localized to either the transmitter or the receiver). The function and purpose of each SRF loop (in either the transmit or receiver side) is completely different from phone line compensation loop schemes used in DSL. The SRF inventive loops have to do with intercarrier-suppression (whereby each carrier is a localized transmitted carrier with more data modulated onto it), and nothing to do with compensating for a particular transmission (phone) line characteristic. By contrast, DSL loops are designed to compensate and adapt to each particular phone line's characteristic. Note that a DSL loop can still be implemented with the inventive SRF loops as elements within it. In other words, the inventive SRF loop described herein and the DSL loops are different loops that may be integrated together if desired, but their functions are completely unique and unrelated to each other.

Known prior art feed-back loops useful in similar applications do not contain an internal loop in the transmitter, and do not show or suggest positive feedback. This is a concept which is explicitly and purposely avoided in system designs, due to the fact that positive feedback results in instabilities and oscillations. In any system design (communications or control) one is always trying to avoid any phase shift approaching 180 degrees (sign inversion) in a typical negative feedback loop (which thus becomes positive feedback). The inventive SRF does exactly the opposite with a first level of positive feedback for the desired signal, and a second level of positive feedback for interfering signals, with the second level of positive feedback being less than the first level of positive feedback. This approach represents an evolution and improvement of the technology described in U.S. Pat. Nos. 5,956,372, 6,075,817 and 7,336,747. Another key feature of the inventive SRF is that it is reset every symbol period. This is a fundamental difference as compared to other loops (even though the purpose of such loops is vastly different than the SRF loop). The typical time constant of a loop (such as DSL for characterizing the phone line and adapting the transmission to it) is on the order of many symbol periods (hundreds), and typically these loops are continuously adapting, with no "hard" reset. The inventive SRF described herein resets every symbol period, (described below) which is related to its purpose of data recovery, rather than for transmission line adaptation.

The system operates on samples of the input signal over one symbol period T or less so there is no coherent relationship between successive symbol periods. Each symbol period T starts afresh, although within the symbol period T there may be several frequencies which may be recoverable by another TXSRF.

As shown in FIG. 2 input 51 receives the input signals, which are symbols represented by one cycle of a sine wave. The sine waves are sampled n times a symbol and the signals on input 51 have a frequency LO. The input signals are presented to adder 53 which sums the input samples and feedback samples. A squaring function is performed in circuit 54. Circuit 54 multiplies the output of adder 53 by itself thereby producing the square of the adder 53 output. The output of circuit 54 is a voltage with a frequency of twice the input frequency LO. Local oscillator 55 oscillates with a frequency LO. The output of the local oscillator 55 and output of squaring circuit 54 are multiplied by multiplier 56. Multiplier 56 provides an output comprised of 1LO and 3LO.

The output of multiplier 56 is presented to square root circuit 60 which provides the square root of the amplitude of the output of multiplier 56. The output of adder 53 is also applied to sign extractor 61. Sign extractor 61 extracts the sign of this signal which is used to multiply the output of square root circuit 60 in multiplier 62. The output of multiplier 62 is fed back through delay unit 63 which delays the output sample pulses one sample period (i.e. 1/n).

In circuit 54 the $x^2$ operation provides sinusoids whose phase angle has doubled, i.e., x=a sin a becomes $x^2=a^2 \sin^2 a$ or $a^2$ (sin 2a−1). When this signal is multiplied by the output of the local oscillator 55 outputting a signal of sine a, the result is $a^2$ sine a. This signal is exactly in phase with the input signal.

It should be noted that the sample of the signal is also in phase with the local oscillator LO. When the sample is delayed by one sample period (1/n), it adds to the newly received sample period. However, before this addition takes place, the square root of $a^2$(sin 2a−1) sine a results in a sine a. Because the square root process removes the sign, it is necessary to ensure that the output of the square root process has the input sign restored.

When the local oscillator frequency is not exactly equal to the incoming frequency and phase, the operation is different. When the local frequency angle is a−ϕ, the output phase angle is 2a−a−ϕ which equal a−ϕ and when the local frequency angle is a−ϕ, the output angle is a−ϕ so whether the incoming signal frequency is above or below the desired locally selected frequency, the feedback delayed signal is out of phase with the input signal and does not add.

The addition of the samples amounts to an integration of the selected sinusoidal wave resulting in a peak signal of n/2π. The sample amplitudes are large over a 30 degree interval. Thus, the integration is most intense near the peaks of the input signal.

The integration of sequential sampling pulses requires that the spectrum of each overlap the other at the information channel frequency. Only this spectrum is needed to develop and transfer the information across the channel. Thus, the entire spectrum of the sampling pulse is not required.

The output at 64 is a summation of the amplitudes of the sample intervals which are T/n in time size (there are n samples per symbol period) and there is a positive peak at 90 deg., and a negative peak at 270 deg. The magnitude of the summed peaks is about n times the peaks of the input sine wave. The width of the output peaks approximate x (T/n), where x is in the order of 3 or 4 and is very narrow with respect to the symbol period. This permits successive symbols to be transmitted close together with a time separation slightly longer than x (T/n) without the output peaks interfering with one another. The above means that the bit throughput rate is $n_t n_f$ where $n_t$ is the number of time samples per symbol and $n_f$ is the number of frequency channels per channel width. The output 64 derives its frequency from the frequency and spectrum of incoming signal 51. Since only a line spectrum is presented to input 51, the output must also be a line spectrum regardless of the time and frequency spacings of the input 51. The line frequency spectrum means that the interference from channel noise is greatly reduced because that power increases directly with bandwidth whereas the information signal occupies only a limited bandwidth. Thus if the band of the channel must have a bandwidth of 1 MHz to pass a 1 microsecond pulse, the noise improvement is $10^6$ or 60 dB. This allows great distances or even larger data rates to be handled.

The spike filter shown in FIG. 2 has two important elements. First, there is a forward path element for the incoming signal consisting of squarer 54, multiplier 56 with a LO and the square root (60) and sign extract (61) components. Second, there is a feedback path adding the output to the input which creates a small phase shift versus frequency of the forward signal path. This small phase shift is repeated n times such that the cumulative affect becomes significant enough in the course of a symbol period T to produce a narrow band, yet fast acting filter with a bandwidth substantially less than 1/T but with a response time of T.

It is also important to understand that the feedback loop comprising elements 53-55 and 60-63 provides two levels of positive feedback with one level being less positive than the other level. Specifically, when presented with a desired signal (whose frequency is the same as the LO frequency), then the effect of the loop is positive feedback—causing the characteristic amplitude of that signal to increase. Likewise, when presented with an undesired frequency (such as an interferer whose frequency is different from that of the LO in that particular SRF, or wideband noise which is constituted of many other frequencies), the effect of all these elements within the loop (including summer 53) is to provide a lesser degree of positive feedback (which is equivalent to negative feedback in relation to the desired signal), resulting in a smaller increase in the characteristic amplitude of the undesired signal(s). The net effect of the use of a positive feedback loop implemented both within the Transmit SRF and the Receive SRF circuits is to increase the overall Signal-to-Noise, or Signal-to-Interferer ratios. In general, positive feedback systems or circuits are not used in the signal path of a communications system, as this leads to instabilities and oscillations. Applicants' use of positive feedback is highly unconventional, and is fundamental to the operation of the invention. The Applicants' circuit does not exhibit oscillation because the Transmit SRF and the Receive SRF are "reset" after the completion of each symbol period's signal processing. In FIG. 2, the positive feedback path (element 63) is broken for a very small period of time (very small in relation to the symbol period) and the value of zero is fed back. This effectively removes all the memory of the positive feedback loop, causing that loop to start its processing anew for a new data symbol period.

The SRF circuit (at both transmit and receive ends) must be reset in between symbol periods (either at the end of a symbol period T or at the beginning of the next symbol T—both of these are equivalent times, being separated by a very small amount of time T/n). Each symbol period "T" (for example, lasting 1usec for a 1MSymbol/sec transmission rate) is further broken into smaller time increments "n" times. For example, if n=1,000 then the 1/n delay (63 in FIG. 2) is 1usec/1,000=1nsec. A RESET PULSE, synchronized to the symbol period T is generated, and whose value is "zero" for exactly 1nsec (or a time duration of T/n), and "one" for all other times (71 in FIG. 2). Note that the RESET PULSE has a value of "zero" precisely on the last 1nsec (T/n) step of the current symbol period T, or on the first nsec (T/n) of the next symbol period T. The RESET PULSE is multiplied with the feedback path of the SRF. When the value of the RESET PULSE is "one", the circuit operates as if 50 and 52 are not present. When the value of the RESET PULSE is "zero", the circuit operates as if it is open loop, and there is no feedback.

The effect of this RESET PULSE process is to "reset" the SRF loop for the duration that the RESET PULSE has a value of "zero". This is akin to having no feedback (breaking the feedback path) for a small time period of duration T/n. This results in the SRF loop "losing" all its memory from the previous symbol period T, such that each symbol period T is processed independently from its previous symbols of its following symbols. Hence the SRF circuit exhibits no inter-symbol interference.

Another critical purpose of the RESET PULSE is to ensure that the positive feedback circuit that is characteristic of the SRF does not lead to uncontrolled oscillation over the course of multiple contiguous symbol periods. Such an oscillation would render the use of positive feedback, a fundamental operating principle of the SRF circuit, useless.

Note that the RESET PULSE may be just as effectively applied via the multiplier (70) anywhere in the SRF loop, rather than strictly after the 1/n delay (63) as shown in FIG. 2. Other means of resetting the SRF loop may also be employed, so long as the operative function is to cause the loop to "forget" any state (history) from its past signal processing at the appropriate time relative to the symbol period T. For example, note that if the value of the LO (55) is zero for at least one T/n period (as it would be if it is a sinusoid at 0 and 180 degrees), then this particular LO is effectively also causing an inherent loop reset function during the times when its value is zero. However, one has to ensure that the LO has a value of zero at the beginning of the T symbol period (which is not true if the LO is, for example, a Cosine whose value is "1" rather than "0" at the beginning of the symbol period T).

The operation of the SRF at the receiving end is to simultaneously apply positive feedback to the desired signal, as well as less positive (negative) feedback to the undesired signal(s). The final result of the receiver SRF's operation is actually in the differential behavior applied to all of its input signals combined, such that the net difference in phase response of the loop, applied many times (through the feedback process), is what ultimately causes the beneficial behavior of that system. In other words, it's not only "positive" or "negative" feedback, but rather the difference between these two effects as applied onto the desired vs. undesired signals. The combined multiple modulated frequencies (virtual channels) are used as the input to the SRF at the receiver. The local oscillator of the SRF is tuned to the desired frequency for data recovery. The LO and the desired modulated frequency are synchronized in phase and frequency. However the remaining modulated frequencies (virtual channels) have a phase offset with respect to the local oscillator. The SRF processes each symbol independently and is reset for the next symbol processing. The positive feedback is used in conjunction with a large number of samples, (e.g. 1 million) of these signals. The amplitude of each sample of the signal is cumulatively added with the previous amplitude and the cumulative amplitude of the modulated frequency (virtual channels) which is synchronized to the local oscillator, will have an amplitude increase faster than that of the frequencies that have phase offset with the local oscillator. In effect, the cumulative energy of the desired frequency is much larger than the cumulative energy of the other frequencies. This increased separation allows increased data rate.

The affect of the SRF loop is based on a continuum of phase shifts, which the feedback process "enhances" through numerous repetitions ("n" repetitions). For very close-in (but not center-frequency) signals, the phase shift is very small, but accumulates. Likewise, for frequencies that are further away, the phase shift is larger, but also cumulative. The term "far" frequencies is a relative term with the goal being the elimination of in-band interference. In conventional terms, this "far" frequency would be considered in-band, and too close to eliminate or to even reduce.

The term "characteristic amplitude" rather than to just plain "amplitude" is used in the discussion above. The reason is that the SRF does not merely amplify the desired signal, and attenuate the undesired signals, but it also changes the shape of the signals. That shape change is a by-product of the SRF process, and in of itself, is not of great consequence in the receiver. The critical factor is that the resulting new signal (output of the SRF) is mostly influenced by inputs at the center-frequency rather than by inputs at non-center-frequency (i.e., interferers or in-band noise). That the output of the receiver looks like a spike vs. a sinusoid is not important, as long as the amplitude of that spike is primarily due to the center-frequency input.

Referring again to FIG. 1 the output of each TXSRF circuit contains the combination of the effect of the positive feedback SRF circuit, the combined amplitude of the incoming digital bits as well the input supplied by the local oscillator. All TXSRF channel outputs are summed in adder 18 to form the composite transmitted signal.

The line filter 19 (FIG. 1) is a low-pass or band-pass filter. In the case of a typical telephone company line this filter would not necessarily be a physical circuit. Rather the filter shown in FIG. 1 is a model of the low-pass characteristics of the telephone line. There is no need to pre-filter the signal at its source as filtering takes place during transmission from transmitter 30 to receiver 40. In the case of a wireless signal a filter of this type must be implemented at the transmitter to avoid interference with adjacent wireless bands with the harmonics of the transmitted signal.

In most wireless systems the signal output from adder 18 is typically up-converted to the band of interest for wireless transmission and then down-converted back to the chosen baseband frequency. The benefit of this wireless arrangement is that the baseband signal sees the entire wireless transmission path as a flat passband, within the baseband frequency range of interest, unlike its wired telephone counterpart which appears to the transmitted signal as a low pass path.

The output of LPF 19 is applied to RXSRF 1 through RXSRF 4 (reference characters 22-25 respectively) which are of the same configuration as the TXSRF shown in FIG. 2. Each RXSRF is used to decode the received signal transmitted by the transmitter. Each RXSRF operates at the same frequency (delayed) as the corresponding TXSRF and is synchronized to a common clock reference. The clock reference can be transmitted to the receiver in any known manner (not shown) without any significant increase in band width.

Figure 3:
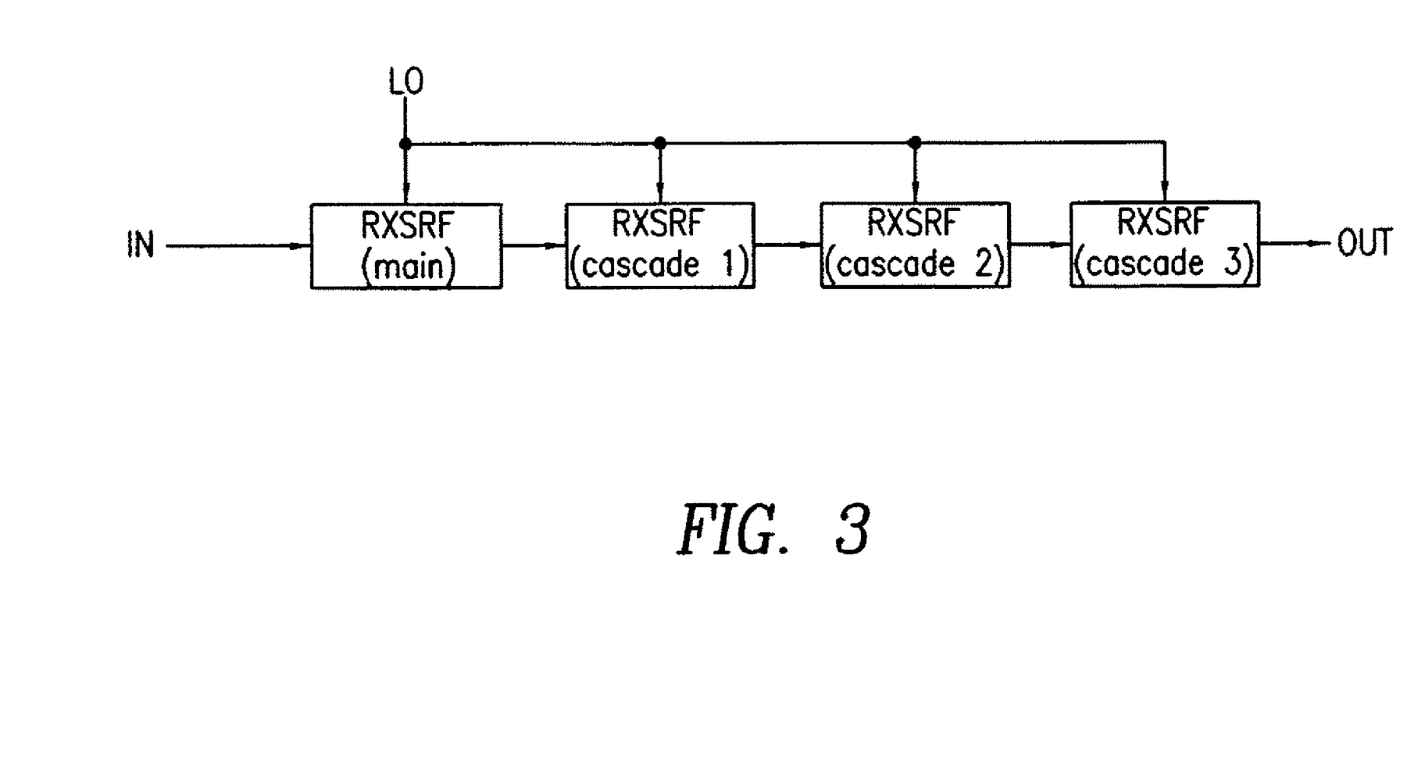
FIG. 3 shows a cascade arrangement of super resonant filters used in the receiver portion of the inventive transmission system.
Figure 4:
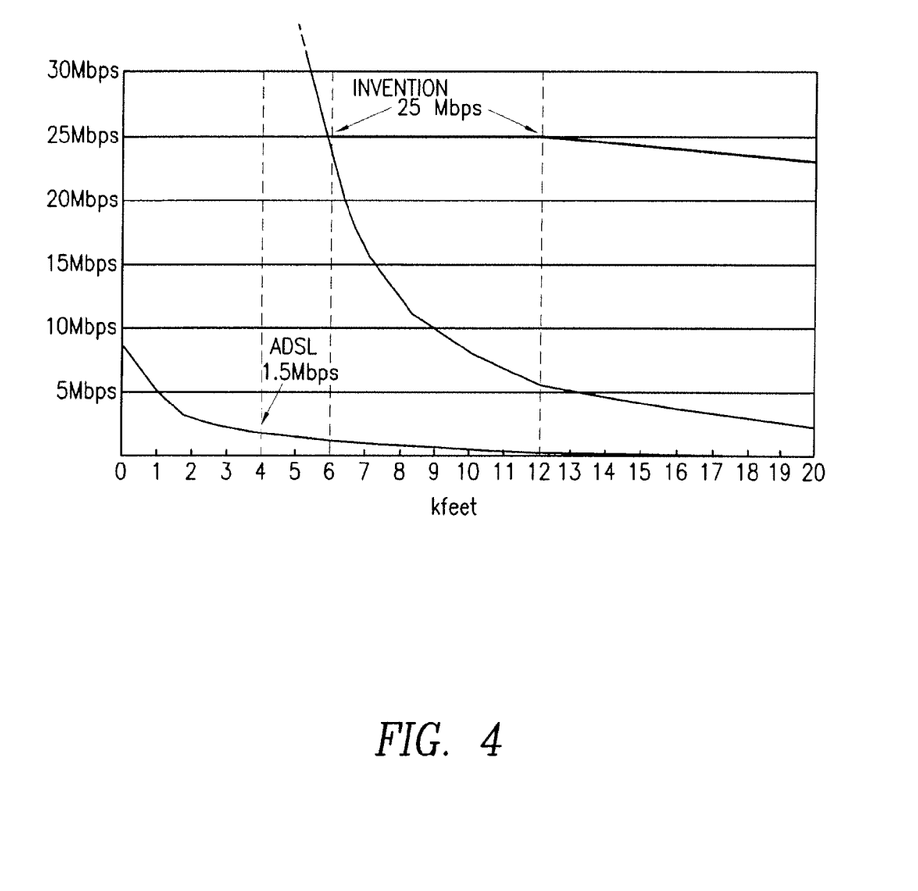
FIG. 4 is a comparison of the inventive system with current ADSL technology.

FIG. 3 illustrates that the RX SRF circuits can be cascaded in series in order to increase the performance of the receiver system. This is particularly useful as more interfering channels are used on the transmit side in order to increase overall data throughput through a band-limited channel. Referring to FIG. 4 there is shown a plot of data rate versus distance when sending data over a typical TTP connection. As shown ADSL provides a data rate of approximately 9 Mbps at the data source which drops to 1.5 Mbps at 4000 feet from the source. In contrast the inventive system described herein can provide a data rate of 25 Mbps at 6000 feet and 3 Mbps at 20,000 feet which is a substantial improvement over ADSL.

The fundamental operation of the TXSRF/RXSRF combination is to reduce the effective noise bandwidth, but not equivalently reduce the signal bandwidth thereby allowing a "fast" signal to be transmitted and recovered where "fast" is relative as compared to the equivalent bandwidth. The use of almost (but not exactly) 100% overlapping signals to carry additional information is made possible by this noise-bandwidth reducing effect. To any one particular frequency channel utilizing the invention, the other overlapping data channels are considered "noise". This is possible due to the inventive combination of the TXRSF, the RXSRF and the matched filter (described below).

As shown in FIG. 1 the output of each RXSRF circuit is applied to a matched filter 26. The matched filter is a time-convolution filter which convolutes the incoming signal with pre-stored waveforms obtained during a training process, described below. Each pre-stored waveform corresponds to the combined effect of all incoming bits although the intent is to decode the 2 or 3 bits that are transmitted by a particular frequency with a particular symbol period. The other bits consist of bits from past symbol periods or from a current symbol period but from a different frequency. For each symbol of 1 μsec duration, and for each frequency, the matched filter performs the convolution and the best match is used to decode the detected 2 or 3 bits for that frequency channel.

Figure 5:
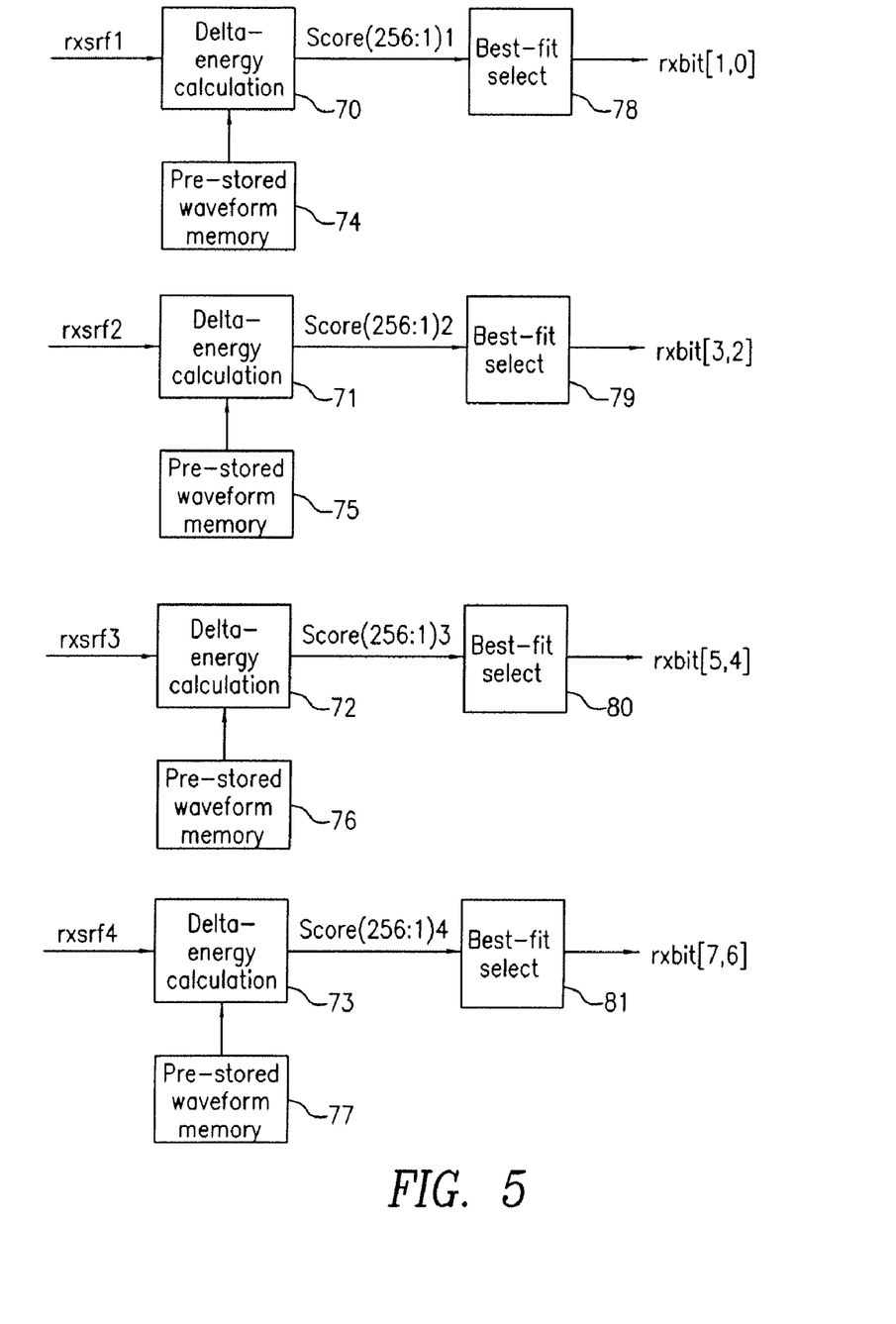
FIGS. 5 and 6 show two possible embodiments of a matched filter for use with the present invention.

FIG. 5 shows a typical arrangement of a matched filter. As illustrated the output of each RXSRF 1-4 is fed into delta-energy calculation modules 70-73. Pre-stored wave forms (described below) are stored in waveform memories 74-77 and applied to the calculation modules which generate a score that depends on the difference between the incoming waveform and the pre-stored waveform. Best-fit select modules 78-81 then make a decision about the best-matched waveform, from the pre-stored series of "ideal" (no noise) waveforms. These ideal pre-stored wave forms have been previously computed and stored in the memory modules during the "training" phase of the connection, for example, when zero noise is added in order to have "ideal" waveforms for subsequent comparison with actual transmission waveforms which include noise.

Figure 6:
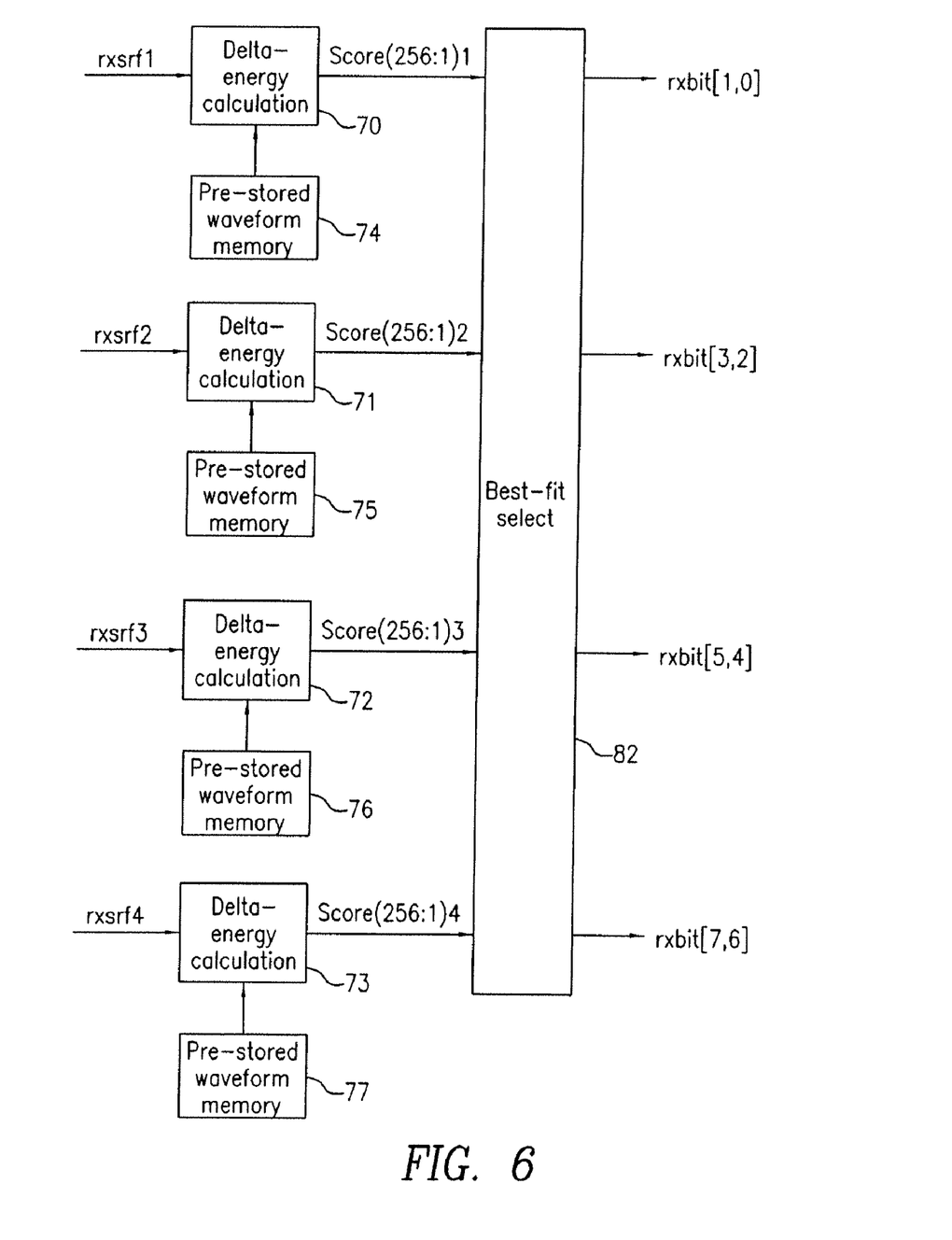

FIG. 6 shows similar arrangement as FIG. 5, except that the decision for the best-fit is made on a multi-channel basis in the best-fit select module 82. Each RXSRF path still computes the list of scores for the incoming waveform as compared to all possible ideal waveforms. This list of scores is then combined with the similar list from all other channels and a system-wide decision is made as to the output bits. This approach can generally improve the overall noise performance when compared to the single-channel decision method.

The purpose of the training process is to store in memory the appropriate signal waveform. Typically training is performed by presenting the matched filter's input with the signal-to-be-detected, in a fashion where this signal is "ideal" i.e. has not been distorted and contains no noise. This technique is not always practical as it is normally not possible to turn off noise in a real world transmission channel. Other techniques involve the pre-computation of the matched filter's contents in a laboratory environment, rather than during usage in the field. Another technique performs a characterization of the transmission medium (for example, using spectrum analysis) from which the ideal waveform is computed indirectly and then stored in the matched filter.

Once the matched filter has been trained, it is ready for operation. The matched filter's output is not an analog signal. Rather, its output is a "score" as described above which indicates the likelihood of the presence of the desired signal at the input to the matched filter. Typically a threshold comparison on the output of the matched filter is used to decide if the signal was present with a sufficient probability of success.

The operation of the matched filter is a time-domain correlation, and is a known technique in communications and detection systems. One common method is to take the sum of the squares of the differences in time (the difference of the input waveform to the ideal waveform).

Imagine an ideal sinusoid overlaid on top the same sinusoid which has a slight distortion. Where the two waveforms are equal in amplitude, the difference is zero. Where they are not, the difference is a non-zero value. When this comparison is performed on two waveforms over a number of time points (samples) on these waveforms, a series of numbers is generated, each representing the fidelity of the input waveform to that of the ideal waveform, at each particular point in time. The square each of these values (so that they are all positive), is summed together to obtain the final matching score. Note that if the two waveforms are identical, then each difference point is zero, and the sum of these points is also zero. Hence, a zero score means an ideal match. Likewise, a high score means there is less correlation between the incoming and ideal waveforms.

The more points in time that the comparison over the signal is performed the more accurate and the more resolution such a filter allows for comparing different but close-to-identical signals (i.e., more bits per symbol).

Training for a matched filter is performed for each connection and retraining can also be performed periodically. Generally, the training of a matched filter is done when the filter is manufactured as the signal to be matched is not expected to be altered by the transmission medium but rather to be corrupted with noise. Therefore with a typical matched filter the training of the filter is straightforward as it is known what the signal to be recovered looks like. For the present invention however the characteristics of a particular communications highway will effect the signal to be matched, and it cannot be known a priori the line characteristics to pre-program the matched filter.

Therefore in order to pre-program the matched filter with the present invention a line-specific or connection-specific spectral response test is performed. Such spectral response tests are known in communications technology and need not be further described herein. Based on the results of the spectral response test it is possible to calculate, with a pre-determined algorithm, the effect of a line's unique characteristics on the desired signal. After applying the pre-determined algorithm the resultant signal can then be stored as the training signal in the matched filter.

Various algorithms can be used but one exemplary algorithm for use with the present invention comprises the following steps;

(a) To determine the line filtering characteristics the transmitter transmits a series of pure frequencies in a predetermined sequence. An example is to sweep from 100 kHz to 1.5 MHz in 1 kHz steps for 1 μsec each. The receiver receives these frequencies and creates a spectral mapping of the line's passband to develop a spectrum analysis of the line.

(b) The receiver uses the passband characteristics of the spectrum analysis in its internal simulation of the transmitter, line and receiver to compute the waveforms that the output of the RXSRF would present to the matched filter.

(c) Repeat step (b) for each series of bit combinations.

(d) Store the results of (b) and (c) in the matched filter.

Creating a spectral mapping to develop a spectrum analysis which is based on a line's passband is a known technique. Once the spectrum analysis has been developed computation of the waveforms required for the matched filter can also be accomplished utilizing known techniques.

Referring again to FIG. 5 rxbits (1,0) through rxbit (7,6) are generated by best-fit select modules 78-81. The rxbits (1,0) through rxbits (7,6) are equal to txbits (1,0) through txbits (7,6) which were applied to transmitter 30, thereby allowing accurate recovery of the transmitted signal at the receiver.

The capability of the inventive technology using IEEE 802.9 ISLAN Unshielded Telephone Twisted Pair Filter (1 MHz Band Pass Filter) as the channel demonstrated the maximum data rate of 25 Mbit/s using 9 frequencies with each frequency carrying 3 bits of data and the two end frequencies each carrying 2 bits of data, which is the maximum allowable with no violation of Shannon's Capacity limit. Therefore, the inventive technology has the ability to transmit 25 Mbit/s in a 1 MHz bandwidth. The core invention supports overlapped modulated frequencies at the transmit side and suppresses the inter-frequency interference at the receiving side. By default, any other interference also is suppressed. With minimal guard band, the amount of data rate that can be supported over a (B)MHz channel is 25(B) Mbit/s. A typical broadband channel of 6 MHz using the inventive technology can deliver 150 Mbit/s and a 30 MHz channel can deliver 750 Mbit/s. Similar data rates are achievable in wireless channels also.

A comparison was also made of the inventive system performance to the performance of conventional Quadrature Amplitude Modulation (QAM) for the case in which the channel contained both Inter symbol Interference (ISI) and Additive White Gaussian Noise (AWGN). For higher data rates, when both systems were compared under the constraint of equal energy-per-bit, the inventive technology out-performed the single-carrier QAM system. For example, when the alphabet size was six bits per symbol, the inventive system out-performed the convention QAM system by about five to six dB in the ratio of energy per bit to noise power spectral density. For this comparison the waveform consisted of six closely spaced tones, each employing Binary Phase Shift Keying (BPSK) modulation, whereas the conventional single-carrier system employed 64-QAM modulation. These superior results as compared to prior art systems is due to the combination of the basic waveform at the input to the transmitter SRF, the type of signal processing performed by the transmitter SRF and an appropriate form of receiver filtering, as typified by the receiver SRF.

The description of certain embodiments of this invention is intended to be illustrative and not limiting. Therefore, although the present invention has been described in relation to particular embodiments thereof, many other variations and other uses will be apparent to those skilled in the art. It is understood therefore that the present invention is not limited by the specific disclosure herein, but only by the broadest scope of the appended claims. Possible and known variations for the circuitry described herein can be implemented in a number of different ways as long as the operation of the inventive system and method falls within the appended claims.

The invention claimed is:

1. Apparatus for increasing the channel capacity of a bandwidth limited communications path, comprising:

a plurality of oscillators for generating a plurality of different carrier signals, each carrier signal having a different frequency and each carrier signal being modulated by a multibit information signal having a predetermined symbol period T, the bandwidth of said bandwidth limited communications path being less than a summation of the plurality of carrier signal bandwidths, a plurality of separate transmit feedback loops to which each modulated carrier signal is applied, said transmit feedback loops providing a first level of positive feedback to each modulated carrier signal and a second level of positive feedback to signals interfering with said modulated carrier signals, said second level of positive feedback being less than said first level of positive feedback, and a reset pulse generator for opening each separate feedback loop at least once each symbol period T to prevent unwanted oscillation within said feedback loop.

2. The apparatus in accordance with claim 1 wherein said reset pulse generator provides a reset pulse of predetermined duration whereby each of said feedback loops are opened for the duration of said reset pulse and no positive feedback is provided.

3. The apparatus in accordance with claim 1 wherein an adder sums each modulated carrier signal and applies the summed modulated carrier signals to the bandwidth limited communications path.

4. The apparatus in accordance with claim 3 wherein there is further included a plurality of receive feedback loops to which said summed modulated carrier signals are applied.

5. The apparatus in accordance with claim 4 wherein there is further included a matched filter, said matched filter operating in conjunction with said receive feedback loops to recover said multibit information signals from said summed modulated carrier signals.

6. A method for increasing the channel capacity of a bandwidth limited communications path, comprising the steps of:

generating a plurality of carrier signals, each of the plurality of carrier signals having a different predetermined frequency, the bandwidth of said bandwidth limited communications path being less than a summation of the plurality of carrier signal bandwidths, modulating each carrier signal with a plurality of multibit information signals, each information signal having a predetermined symbol period T, and applying each modulated carrier signal to a separate feedback loop, said separate feedback loop providing a first level of positive feedback to each modulated carrier signal and a second level of positive feedback to signals which interfere with said modulated carrier signal, said second level of positive feedback being less than said first level of positive feedback, whereby said modulated carrier signal strength is increased and said interfering carrier signal strength is decreased in relation to said modulated carrier signal strength.

7. The method in accordance with claim 6 wherein a reset pulse of predetermined duration is applied to each of said separate feedback loops at least once during each predetermined symbol period T.

8. The method in accordance with claim 7 wherein each separate feedback loop is opened in response to said reset pulse whereby no positive feedback is provided by each said separate feedback loop for the predetermined duration of the reset pulse.

9. The method in accordance with claim 8 wherein each of said plurality of modulated carrier signals are added together after being applied to said separate feedback loops, with the sum of said modulated carrier signals being applied to said communications path.

10. The method in accordance with claim 9 wherein each of said feedback loops provides a continuum of accumulating phase shifts to said modulated carrier signals and to said interfering signals with the accumulated phase shift being larger for interfering signals than for modulated carrier signals whereby in-band interference between plurality of the carrier signals is reduced.

11. A method for increasing the channel capacity of a bandwidth limited communications path, the communications path carrying a first signal having information associated therewith and a second signal capable of interfering with and degrading the first signal, comprising the steps of:

applying the first and second signals to a feedback loop, and concurrently generating within the feedback loop both a first level of positive feedback for increasing the amplitude of the first signal and a second level of positive feedback for decreasing the amplitude of the second signal, with the second level of positive feedback being less than the first level of positive feedback.

12. A method in accordance with claim 11 wherein said communications path includes a transmitter and a receiver, the method further including the steps of applying the first and second signals to a first feedback loop located at the transmitter and a second feedback loop located at the receiver.

13. A method in accordance with claim 11 wherein the generating step further includes generating a continuum of phase shifts versus frequency in a forward signal path of the feedback loop, the phase shifts being repeated and enhanced through n repetitions.

14. A method in accordance with claim 13 wherein the phase shifts for a first frequency close to a predetermined center frequency accumulate at a first rate while phase shifts for a second frequency further away from the predetermined center frequency accumulate at a second rate, the second rate being substantially larger than the first rate.

15. A method in accordance with claim 14 wherein said first frequency is close to a preferred frequency for said first signal whereby said first signal is increased in amplitude with respect to said second signal.

16. A method in accordance with claim 12 wherein there is further included a matched filter associated with said receiver, the method further including the steps of storing in said matched filter an ideal signal and comparing the ideal signal to said first signal to further differentiate said first signal from said second signal.

17. Apparatus for increasing the channel capacity of a bandwidth limited communications path, comprising;

a transmit feedback loop for increasing the amplitude of an information bearing signal by applying a first level of positive feedback to the information bearing signal, and to interfering signals a second level of positive feedback, with the second level of positive feedback being less than the first level of positive feedback, and a receiver feedback loop having associated therewith a matched filter for differentiating said information bearing signals from said interfering signals.

18. Apparatus in accordance with claim 17 wherein said transmit feedback loop and said receive feedback loop include a feedback path which creates a small phase shift versus frequency of a signal present on a forward signal path of said transmit and receive feedback loops.

19. Apparatus in accordance with the claim 18 wherein said bandwidth limited communications path is connected between a plurality said transmit feedback loops and a plurality of said receive feedback loops said information bearing signals comprising a plurality predetermined information bits modulating by a plurality of local oscillators, said information bearing signals being applied to respective inputs of said transmit feedback loops and respective outputs of said transmit feedback loops being summed and applied to said bandwidth limited communications path.

20. Apparatus in accordance with claim 19 wherein said information bearing signals and said interference signals travel over said bandwidth limited communications path and are applied to inputs of said plurality of receive feedback loops, said receive feedback loops further increasing the amplitude of said information bearing signals while reducing the amplitude of said interfering signals whereby said matched filter associated with each of said plurality of receive feedback loops differentiates between information bearing signals and interfering signals.

* * * * *